US006949779B2

(12) United States Patent
Kai et al.

(10) Patent No.: US 6,949,779 B2
(45) Date of Patent: Sep. 27, 2005

(54) MAGNETORESISTIVE ELEMENT AND MAGNETIC MEMORY

(75) Inventors: Tadashi Kai, Kanagawa-Ken (JP); Shigeki Takahashi, Kanagawa-Ken (JP); Tomomasa Ueda, Kanagawa-Ken (JP); Tatsuya Kishi, Kanagawa-Ken (JP); Yoshiaki Saito, Kanagawa-Ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 86 days.

(21) Appl. No.: 10/653,098

(22) Filed: Sep. 3, 2003

(65) Prior Publication Data

US 2004/0062938 A1 Apr. 1, 2004

(30) Foreign Application Priority Data

Sep. 30, 2002 (JP) ...................................... 2002-287412

(51) Int. Cl.[7] ................................................ H01L 29/76

(52) U.S. Cl. ........................... 257/295; 365/66; 365/97; 365/98; 365/158; 365/171; 365/173

(58) Field of Search ............................. 365/66, 97, 98, 365/158, 171, 173

(56) References Cited

U.S. PATENT DOCUMENTS

| | | | | |
|---|---|---|---|---|
| 5,757,695 A | * | 5/1998 | Shi et al. | 365/158 |
| 6,005,800 A | | 12/1999 | Koch et al. | |
| 6,028,786 A | * | 2/2000 | Nishimura | 365/173 |
| 6,211,559 B1 | | 4/2001 | Zhu et al. | |
| 2002/0130339 A1 | | 9/2002 | Kishi et al. | |
| 2003/0151944 A1 | | 8/2003 | Saito | |
| 2003/0161181 A1 | | 8/2003 | Saito et al. | |
| 2004/0052006 A1 | | 3/2004 | Odagawa et al. | |

FOREIGN PATENT DOCUMENTS

| | | |
|---|---|---|
| EP | 0 913 830 A2 | 5/1999 |
| EP | 1 398 835 A1 | 3/2004 |
| JP | 2001-015826 | 1/2001 |
| JP | 2002-26427 | 1/2002 |
| JP | 2002-43159 | 2/2002 |
| JP | 2002-280637 | 9/2002 |
| WO | WO 02/099906 A1 | 12/2002 |
| WO | WO 02/103798 | 12/2002 |

OTHER PUBLICATIONS

Tzu–Ning Fang, et al., "2D Write Addressability of Tunneling Junction MRAM Elements", IEEE Transactions on Magnetics, vol. 37, No. 4, XP–001110930, Jul., 2001, pp. 1963–1966.

* cited by examiner

*Primary Examiner*—David Nelms
*Assistant Examiner*—Mai-Huong Tran
(74) *Attorney, Agent, or Firm*—Oblon, Spivak, McClelland, Maier & Neustadt, P.C.

(57) ABSTRACT

There are provided a first reference layer, in which a direction of magnetization is fixed, and a storage layer including a main body, in which a length in an easy magnetization axis direction is longer than a length in a hard magnetization axis direction, and a projecting portion provided to a central portion of the main body in the hard magnetization axis direction, a direction of magnetization of the storage layer being changeable in accordance with an external magnetic field.

25 Claims, 11 Drawing Sheets

MAGNETORESISTIVE ELEMENT AND MAGNETIC MEMORY

CROSS-REFERENCE TO RELATED APPLICATIONS

This application is based upon and claims the benefit of priority from prior Japanese Patent Application No. 2002-287412, filed on Sep. 30, 2002 in Japan, the entire contents of which are incorporated herein by reference.

BACKGROUND OF THE INVENTION

1. Field of the Invention

The present invention relates to a magnetoresistive element and a magnetic memory.

2. Related Art

Various types of solid-state magnetic memories have been proposed. Recently, magnetic random access memories using magnetoresistive elements showing a giant magnetic resistance effect as storage elements have been proposed. In particular, magnetic memories using ferromagnetic tunnel junction elements as magnetoresistive elements have drawn attention.

A ferromagnetic tunnel junction typically has a three-layer structure including a first ferromagnetic layer, an insulating layer, and a second ferromagnetic layer. A current flows by tunneling through the insulating layer. In this case, the junction resistance value varies in proportion to the cosine of the relative angle between the magnetization direction of the first ferromagnetic layer and the magnetization direction of the second ferromagnetic layer. Specifically, the resistance value is the lowest when the magnetization direction of the first ferromagnetic layer is parallel to the second ferromagnetic layer, and the highest when the magnetization direction of the first ferromagnetic layer is antiparallel to the magnetization direction of the second ferromagnetic layer. This is called Tunneling Magneto-Resistance (TMR) effect. For example, it is reported that the variation in resistance value caused by the TMR effect is as much as 49.7% (for example, see Appl. Phys. Lett. 77,283, 2000).

In a magnetic memory including ferromagnetic tunnel junctions in memory cells, magnetization of one ferromagnetic layer of each ferromagnetic tunnel junction is pinned to make it a reference layer, and the other ferromagnetic layer is used as a storage layer. In such a memory cell, information is stored by assigning one of the binary data items “0” and “1” to the parallel relationship between the magnetizations of the reference layer and the storage layer, and the other to the antiparallel relationship. The writing of storage information is performed by reversing the magnetization of the storage layer by utilizing a magnetic field generated by allowing a current to flow through separately provided writing wiring (bit line and word line). The reading of storage information is performed by passing a current through the ferromagnetic tunnel junction, and detecting a change in resistance value caused by the TMR effect. The magnetic memory is composed of a number of such memory cells.

Other structures of magnetic memory cells have also been proposed. For example, in one method, a switching transistor is provided to each cell, as in the case of a DRAM (Dynamic Random Access Memory), so as to select a desired cell, and periphery circuits are incorporated in the memory. In another method, a ferromagnetic tunnel junction is located at an intersection of a word line and a bit line together with a diode (for example, U.S. Pat. Nos. 5,640,343 and 5,650,958).

When high integration of a magnetic memory including memory cells having ferromagnetic tunnel junctions is sought, the size of each memory cell is decreased, and thus the size of the ferromagnetic layers constituting each ferromagnetic tunnel junction is also necessarily decreased. Generally, when the size of ferromagnetic layers is decreased, the coercive force thereof is increased. This means that the switching field is increased since the level of coercive force can be an index of the level of switching field required to reverse the magnetization.

Accordingly, a higher current would be needed to flow through the writing wiring in order to write data, thereby increasing power consumption. Therefore, to decrease the coercive force of the ferromagnetic layers used in the memory cells is an important objective in achieving practical utilization of a highly integrated magnetic memory.

A magnetic memory is expected to store information stably since it operates as a non-volatile memory. There is a parameter, thermal fluctuation constant, as an index for long and stable recording, which is generally said to be in proportion to the volume and coercive force of a ferromagnetic layer. Accordingly, if the coercive force is decreased in order to lower the power consumption, the thermal stability is also lowered, resulting in that it is no longer possible to store information for a long time. Therefore, to have a ferromagnetic tunnel junction element that has a higher thermal stability and is capable of storing information for a long time is another important objective in achieving practical utilization of a highly integrated magnetic memory.

Generally, a rectangular ferromagnetic member is used for a memory cell of a magnetic memory. However, it is known that a rectangular minute ferromagnetic member has special magnetic domains, called “edge domains” at its end portions (for example, see J. App. Phys. 81, 5,471, 1997). The reason for this is that the magnetization vectors form a rotating pattern along the short sides of the rectangle so as to lower the demagnetizing field energy. FIG. 14 shows an example of such a magnetic structure. As shown in FIG. 14, at the central portion of the magnetization region, the magnetization vectors align in accordance with the magnetic anisotropy. However, at the end portions, the magnetic vectors align in the directions different from those in the central portion.

When the magnetization of the rectangular ferromagnetic member is reversed, the edge domains grow to increase their area. There are cases where the edge domains at both short sides of the rectangle are parallel with each other, and cases where the edge domains are antiparallel with each other. In the case of the parallel relationship, the coercive force is increased.

In order to solve this problem, the use of an oval ferromagnetic member as a recording layer has been proposed. (For example, see U.S. Pat. No. 5,757,695). The technique disclosed in this document is that the occurrence of edge domains at the end portions of a rectangle, etc. is suppressed by the use of the sensitive nature of edge domains against the shape of ferromagnet, thereby achieving a single domain. With such a technique, it is possible to evenly reverse the magnetization of the entire ferromagnet, thereby decreasing the reversal field.

Further, the use of a ferromagnet having no right angles, such as a paralleogram, as a storage layer has also been proposed (for example, see JP Laid-Open Pub. No. 273337/

1999). In this case, although edge domains exist, the area thereof is not so large as in the case of a rectangular ferromagnet. In addition, no intricate minute domain is formed in the process of magnetization reversal. Accordingly, it is possible to evenly reverse the magnetization, thereby decreasing the reversal field.

Furthermore, the use of a rectangle having projections at one pair of opposing corners in order to decrease the coercive force as a storage layer has also been proposed (for example, see JP Laid-Open Pub. No. 2002-280637).

Moreover, the use of a multi-layer structure composed of at least two ferromagnetic layers with a nonmagnetic layer being located between the ferromagnetic layers, and with antiferromagnetic coupling existing between the ferromagnetic layers, has also been proposed (for example, see JP Laid-Open Pub. No. 251621/1997, JP Laid-Open Pub. No. 2001-156358, and U.S. Pat. No. 5,953,248). In this case, the two ferromagnetic layers have different magnetic moments or thicknesses, and have opposite-direction magnetizations due to antiferromagnetic coupling. As a result, the magnetizations are cancelled out, and as a whole, the storage layer can be deemed to be a ferromagnet having small magnetizations in the direction of the easy magnetization axis. If a magnetic field is applied to the storage layer in the direction opposite to the easy magnetization axis (the direction of the small magnetizations), the magnetization of the ferromagnetic layers is reversed with the antiferromagnetic coupling being maintained. Since the magnetic lines of force are closed, the influence of the demagnetizing field is slight. Further, since the coercive force of each ferromagnetic layer determines the switching field of the storage layer, the reversal of magnetization with a small switching field can be accomplished.

As described above, it is essential in a magnetic memory to decrease the magnetic field (switching field) for reversing the magnetization of a storage layer and to improve the thermal stability. Accordingly, several shapes of the storage layer and the use of multi-layer structure including antiferromagnetic coupling have been proposed. However, it is known that in a minute ferromagnet included in a small magnetic memory cell, which is used in a highly integrated magnetic memory, e.g., a ferromagnet having a short axis with a width of submicrons to a few microns, a magnetic structure (edge domains) that is different from the magnetic structure of the central portion of the ferromagnet is generated at the end portions of the magnetization regions of the ferromagnet due to the influence of the demagnetizing force.

In a minute ferromagnet used in a memory cell of a highly integrated magnetic memory, the influence of edge domains appearing at its end portions is great, so that the change in magnetic structure pattern caused by the magnetization reversal becomes complicated. As a result, the coercive force and the switching field are increased.

In order to suppress the complicated change in magnetic structure as much as possible, the pinning of edge domains has been proposed (for example, see U.S. Pat. No. 5,748,524 and JP Laid-Open Pub. No.2000-100153).

Although it is possible to control the behavior of magnetization at the time of the magnetization reversal by pinning the edge domains, it is not possible to reduce the switching field. Further, since another structure must be added to pin the edge domains, this method is not suitable for a highly densified structure.

SUMMARY OF THE INVENTION

A magnetoresistive element according to a first aspect of the present invention includes: a first reference layer, in which a direction of magnetization is fixed; and a storage layer including a main body, in which a length in an easy magnetization axis direction is longer than a length in a hard magnetization axis direction, and a projecting portion provided to a central portion of the main body in the hard magnetization axis direction, a direction of magnetization of the storage layer being changeable in accordance with an external magnetic field.

A magnetoresistive element according to a second aspect of the present invention includes: a first reference layer, in which a direction of magnetization is fixed; and a storage layer in which a direction of magnetization is changeable in accordance with an external magnetic field, and a width of a central portion is wider than a width of an end portion, the storage layer having a curved outline which is inwardly constricted at a portion between the central portion and the end portion.

A magnetoresistive element according to a third aspect of the present invention includes: a first reference layer, in which a direction of magnetization is fixed; and a storage layer having a cross shape, in which a length in an easy magnetization axis direction is longer than a length in a hard magnetization axis direction, and a direction of magnetization is changeable in accordance with an external magnetic field.

A magnetoresistive element according to a fourth aspect of the present invention includes: a first reference layer, in which a direction of magnetization is fixed; and a storage layer having an octagonal shape, in which a pair of opposite sides are perpendicular to an easy magnetization axis, an inner angle formed by each of the pair of opposite sides and an adjacent side is 135 degrees or less, and a direction of magnetization is changeable in accordance with an external magnetic field.

A magnetic memory according to a fifth aspect of the present invention includes: a first wiring line; a second wiring line; and the above-described magnetoresistive element, which is provided to an intersection of the first wiring line and the second wiring line.

DESCRIPTION OF THE EMBODIMENTS

Hereinafter, the embodiments of the present invention will be described with reference to the accompanying drawings.

(First Embodiment)

A magnetoresistive element according to the first embodiment of the present invention will be described below with reference to FIGS. 1 to 4. As shown in FIG. 2, a magnetoresistive element 2 of this embodiment is used as a memory cell of a magnetic memory, and is provided at the intersection of a word line 10 and a bit line 12. The magnetoresistive element 2 includes a lower electrode 2*a*, an antiferromagnetic layer 2*b*, a ferromagnetic layer 2*c* serving as a reference layer, an insulating layer 2*d* serving as a tunnel barrier, a ferromagnetic layer 2*e* serving as a storage layer, and an upper electrode 2*f*. The magnetization direction of the ferromagnetic layer 2*c* serving as the reference layer is fixed due to the exchange coupling between the ferromagnetic layer 2*c* and the antiferromagnetic layer 2*b*. The magnetization direction of the ferromagnetic layer 2*e*, serving as the storage layer, is changed due to the external magnetic field. Further, the tunnel conductance is changed in accordance with the relative angle between the magnetizations of the ferromagnetic layers 2*c* and 2*e*.

Figure 1:
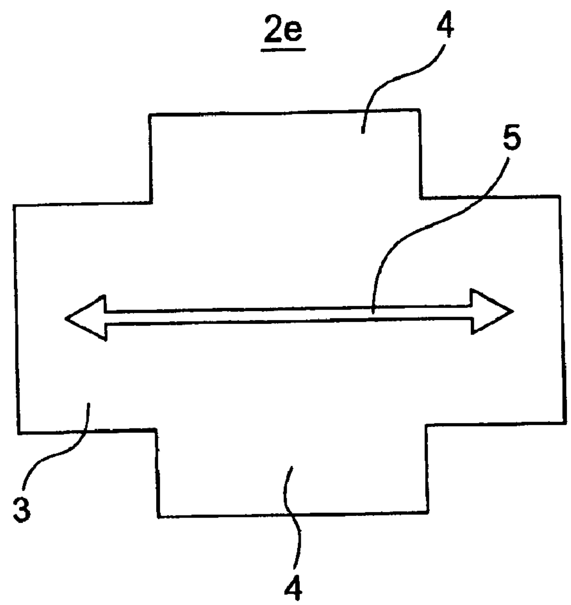
FIG. 1 shows the shape of the top surface of a storage layer of a magnetoresistive element according the first embodiment of the present invention.
Figure 2:
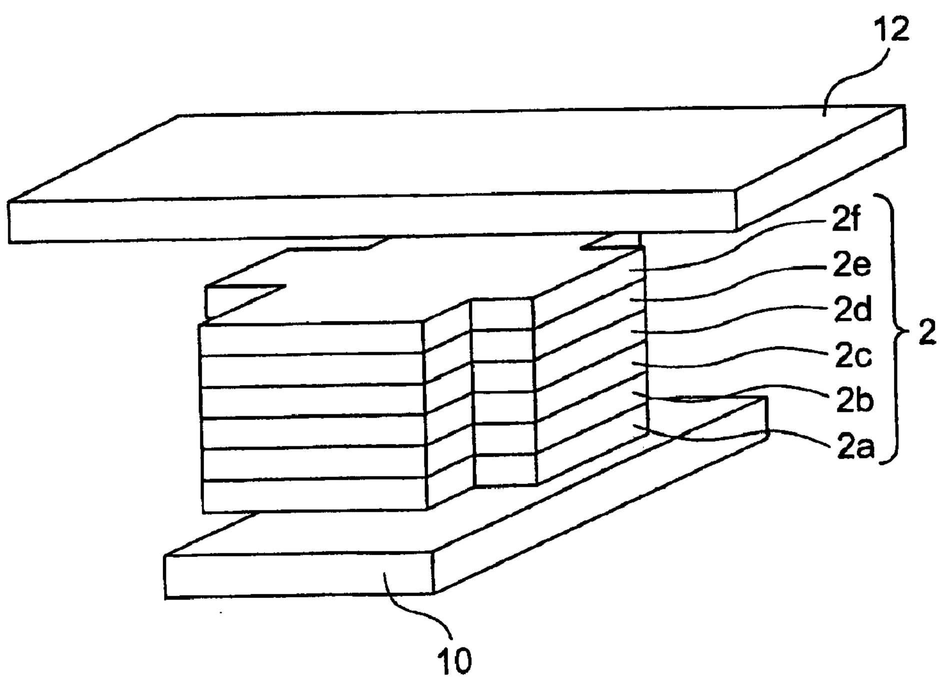
FIG. 2 is a perspective view showing the structure of the magnetoresistive element of the first embodiment.

FIG. 1 shows the shape of the top surface of the ferromagnetic layer 2*e* serving as the storage layer of the magnetoresistive element 2 of this embodiment. As shown in FIG. 1, the ferromagnetic layer 2*e* has a main body 3 in a rectangular shape having longer sides in an easy magnetization axis direction 5, and shorter sides in a hard magnetization axis direction, and projections 4 provided to roughly the central portion of the main body 3. That is, in the storage layer 2*e*, the width (the length in the direction of hard magnetization axis) of the central portion of the main body 3 is wider than the width of the end portions. In addition, the storage layer 2*e* is in a cross shape. For example, the width of the end portions of the main body 3 is 0.24 μm, the width of the central portion of the storage layer 2*e* is 0.36 μm, and the length of the storage layer 2*e* in the direction of the easy magnetization axis is 0.48 μm. Furthermore, the thickness of the storage layer 2*e* is 2 nm. Moreover, in this embodiment, the shapes of the top surfaces of the antiferromagnetic layer 2*b*, the ferromagnetic layer 2*c*, and the insulating layer 2*d* are the same as the top-layer shape of the top surface of the ferromagnetic layer 2*e* serving as the storage layer, as shown in FIG. 2, for the reason relating to the process of manufacturing the magnetoresistive element 2. The shapes of the electrodes 2*a* and 2*f* can also be the same. It is not necessary to shape the antiferromagnetic layer 2*b* and the ferromagnetic layer 2*c* to have the above-described shape. In such a case, the shapes of these layers are different from the shape of the storage layer 2*e*. Similarly, it is not necessary to shape the insulating layer 2*d* to have the same shape as the storage layer 2*e*.

In this embodiment, CoFe is used as the material of the ferromagnetic layers. However, other generally used materials, such as Fe, Co, Ni, and an alloy thereof, can also be used. Further, each ferromagnetic layer can have a multi-layer structure including a layer of any of the above-described materials, and a layer of a metal nonmagnetic material such as Cu, Au, Ru, Al, etc.

Figure 3:
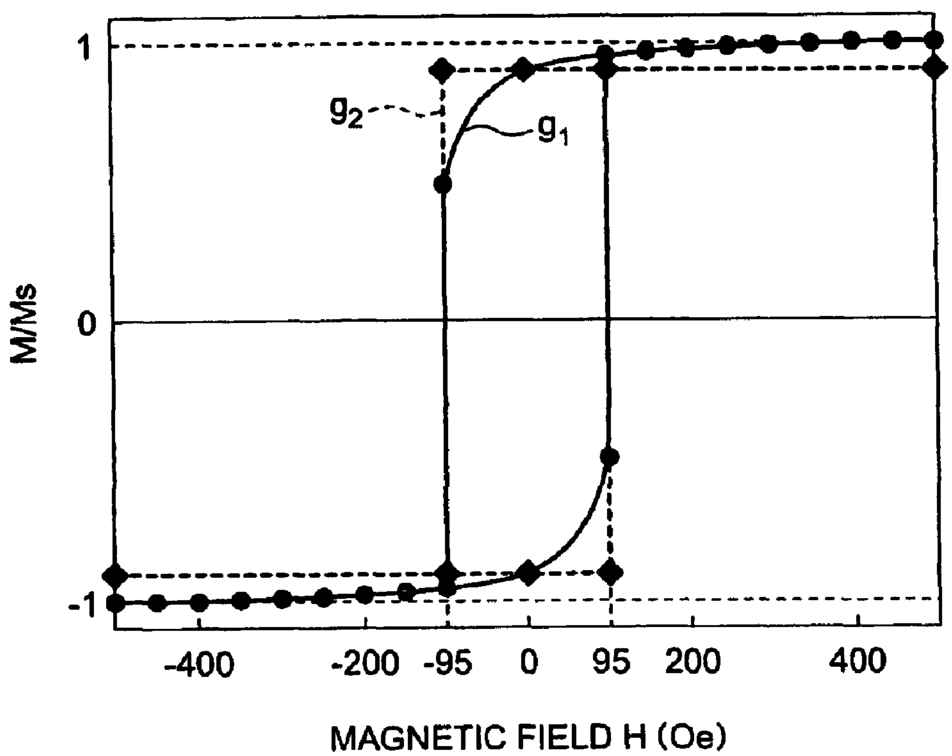
FIG. 3 shows the magnetization curve of the magnetoresistive element of the first embodiment.

FIG. 3 shows a simulated hysteresis loop of the magnetoresistive element 2 of this embodiment. In FIG. 3, the horizontal axis represents external magnetic field, and the vertical axis represents values obtained by normalizing the magnetization values M by the saturation magnetization value Ms. The solid line graph $g_1$ represents the magnetization curve in the direction of easy axis of the storage layer 2, and the broken line graph $g_2$ represents residual magnetization curve, which shows the state of magnetization when the external magnetic field, after being applied, is made to be zero. From FIG. 3, the coercive force in the easy magnetization axis direction can be determined to be 95 Oe. Furthermore, as can be understood from FIG. 3, a sharp switching of the magnetoresistive element of this embodiment is performed, i.e., the magnetization state does not show any intermediate state other than "1" and "0." This means that no complicated minute magnetic domain is generated.

Figure 4A:
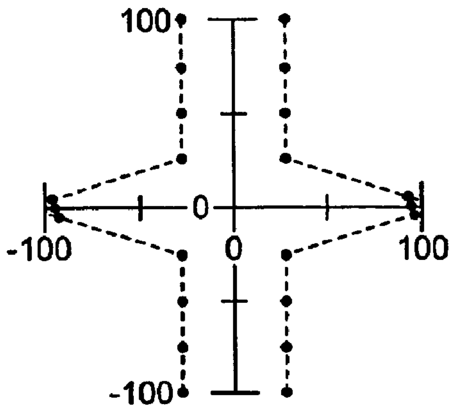
FIGS. 4A and 4B show the results of the calculation of astroid curves of the switching field of the magetoresistance effect element of the first embodiment.
Figure 4B:
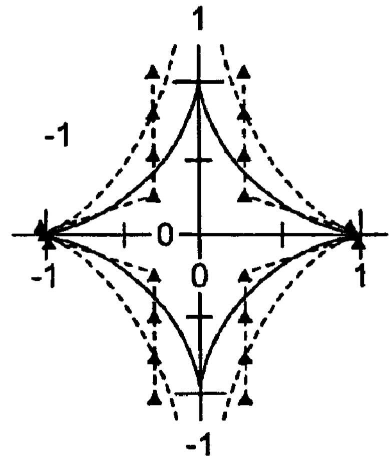
Figure 5A:
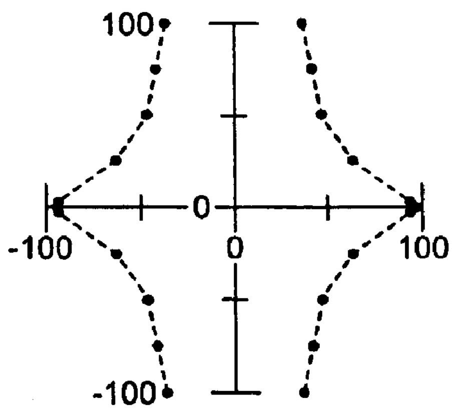
FIGS. 5A and 5B show the results of the calculation of astroid curves of the switching field of a magnetoresistive element including a storage layer having a rectangular shape.
Figure 5B:
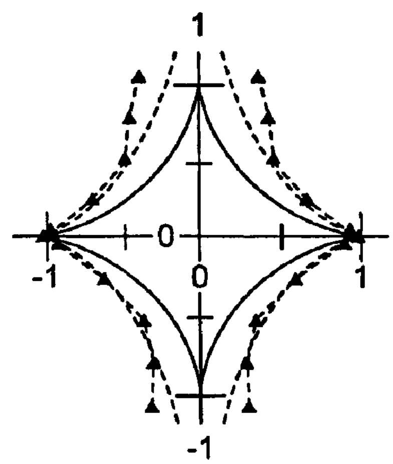
Figure 14:
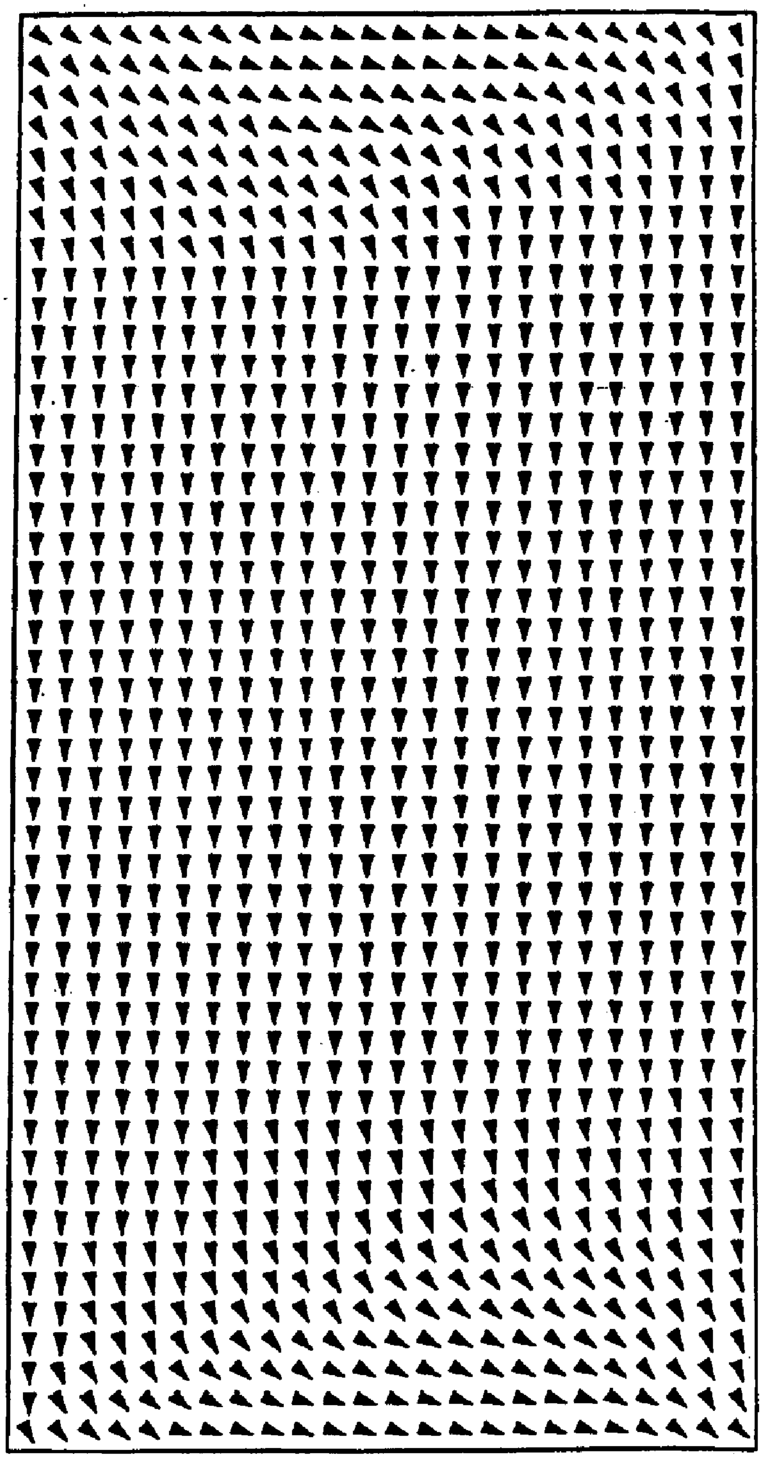
FIG. 14 shows the shape of the top surface of a storage layer of a conventional magnetoresistive element.

FIG. 4A shows the astroid curve of the switching field of the magnetoresistive element of this embodiment, which is simulated. FIG. 4B shows the astroid curve obtained by normalizing the magnetic fields of the horizontal and vertical axes by the coercive force in the direction of easy magnetization axis. In FIGS. 4A and 4B, the horizontal axes represent magnetic field in the direction of easy magnetization axis, and the vertical axes represent magnetic field in the direction of hard magnetization axis. The solid line in FIG. 4B shows an ideal astroid curve of the switching field. For comparison, FIG. 5A shows the astroid curve of a switching field of a magnetoresistive element having a rectangular shape (i.e., a rectangular cell) as shown in FIG. 14, the astroid curve being obtained by simulation. FIG. 5B shows the astroid curve obtained by normalizing the magnetic fields of the horizontal and vertical axes by the coercive force in the direction of easy magnetization axis. In FIGS. 5A and 5B, the horizontal axes represent magnetic field in the direction of easy magnetization axis, and the vertical axes represent magnetic field in the direction of hard magnetization axis. The solid line in FIG. 5B shows an ideal astroid curve of the switching field.

As can be understood from FIGS. 5A and 5B, the simulation results for a rectangular cell is far from the ideal astroid curve. However, as can be understood from FIGS. 4A and 4B, the simulation results for the cell shape of this embodiment is within the ideal astroid curve in a certain direction. Actually, the switching field of the magnetoresistive element of this embodiment is about a half of that of the magnetoresistive element having a rectangular cell. Thus, it is possible to reverse the magnetization with a smaller switching field. Accordingly, it is possible to lower the current that is required to write information. The coercive force in the direction of the easy magnetization axis in this embodiment is substantially the same as that of the rectangular cell, and the thermal stability thereof is not degraded.

In this embodiment, the ratio of the residual magnetization to the saturation magnetization Ms is 0.92, as shown in FIG. 3, which is substantially the same as that of the rectangular cell, which is not shown. The reason for this is the existence of edge domains. Generally, when the ratio of residual magnetization to saturation magnetization is less than 1 due to the existence of misalignment and/or irregularity of the magnetization of the ferromagnet, the tunnel magnetoresistance ratio of the ferromagnetic tunnel junction using such a ferromagnet is decreased as compared with a ferromagnet having no misalignment or irregularity of magnetization. However, in this embodiment, since the upper and lower ferromagnetic layers 2*c* and 2*e*, and the insulating layer 2*d* located therebetween have the same shape, the upper and lower ferromagnetic layers 2*c* and 2*e* have substantially the same magnetic domain structure. Accordingly, although the ratio of the residual magnetization to the saturation magnetization Ms is less than 1, there is substantially no reduction in tunnel magnetoresistance in the direction of magnetization.

It should be noted that unlike conventional elements, the area of edge domains is not decreased in the element of this embodiment, but rather an area of certain size is given to edge domains. A bias magnetic field is applied thereto, so that the edge domains work as the core of magnetization reversal without being pinned.

As described above, this embodiment has a thermally stable magnetic structure, and according to this embodiment, it is possible to decrease the switching field that is required to write information.

Although the shape of the top surface of each layer is a polygon having corner angle of 90 degrees in this embodiment, the shape is not limited thereto, and the corner angle is not limited to 90 degrees. Further, each side is not necessarily composed of a straight line, but a curved line can also be used. Moreover, the size of each layer is not limited, although it is preferable that the maximum width be less than about 1 $\mu$m, and the length be equal to or more than 1.3 times the maximum width and equal to or less than 10 times the maximum width. For the purpose of high integration, it is preferable that the element size be as small as possible.

(Second Embodiment)

Figure 6:
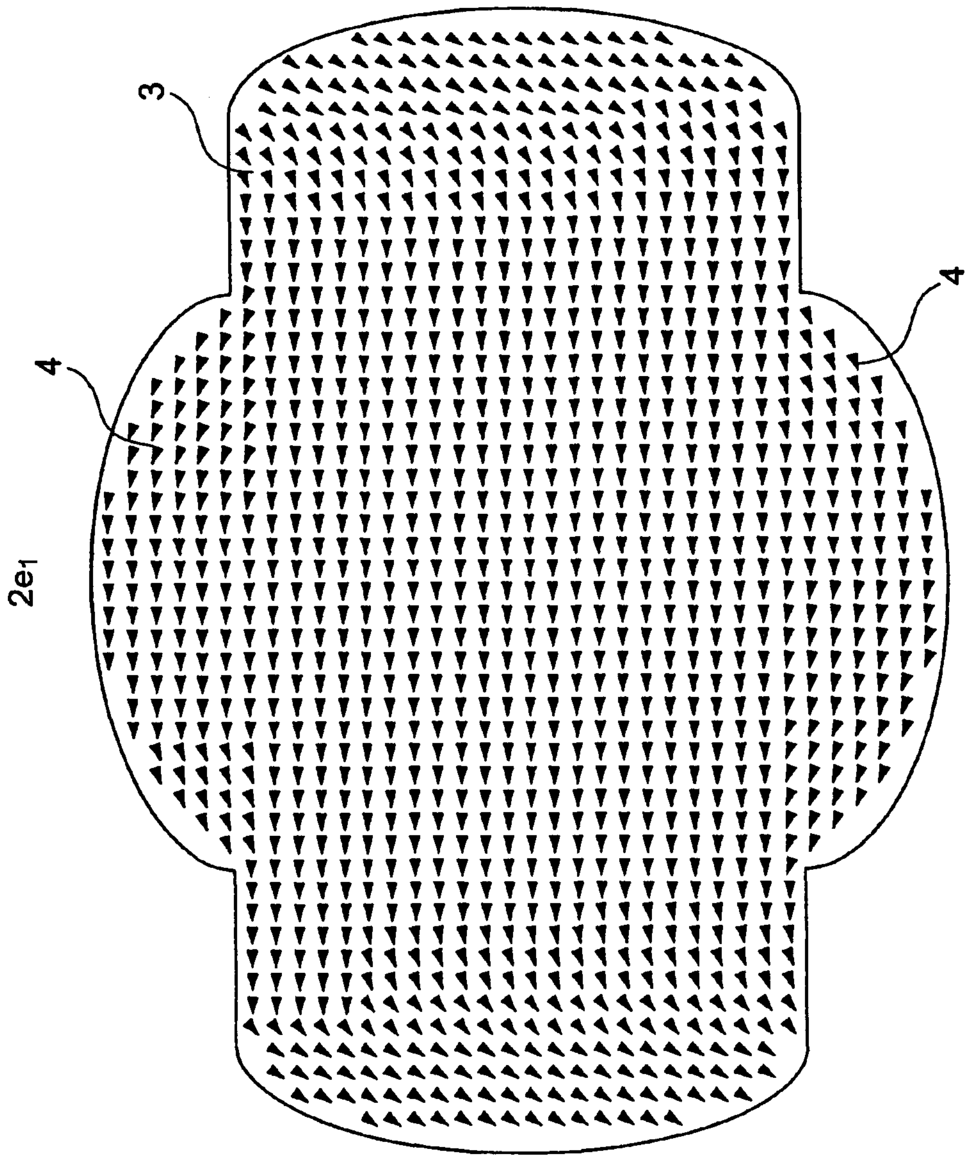
FIG. 6 shows the shape of the top surface of a storage layer of a magnetoresistive element according to the second embodiment of the present invention.

Next, a magnetoresistive element according to the second embodiment of the present invention will be described with reference to FIGS. 6 to 8B. FIG. 6 shows the shape of the top surface of the storage layer of the magnetoresistive element of the second embodiment. As can be understood from FIG. 2, the storage layer $2e_1$ of this embodiment is obtained by rounding the corners of the main body 3 of the storage layer 2*e* of the first embodiment shown in FIG. 1, and further modifying the shapes of the main body 3 and the projections 4 to be semiellipses. This structure would decrease the influence of edge domains in comparison to the first embodiment. In this embodiment, the thickness of the storage layer $2e_1$, for example, is 2 nm, the length thereof is 0.48 $\mu$m, the width of the end portions is 0.24 $\mu$m, and the width of the central portion is 0.36 $\mu$m. Thus, this embodiment is different from the first embodiment with respect to only the shape of the top surface, but the other structural features are the same. That is, as shown in FIG. 2, the second embodiment includes a lower electrode 2*a*, an antiferromagnetic layer 2*b*, a ferromagnetic layer 2*c* serving as a reference layer, an insulating layer 2*d* serving as a tunnel barrier, a ferromagnetic layer 2*e* serving as a storage layer, and an upper electrode 2*f*.

Figure 7:
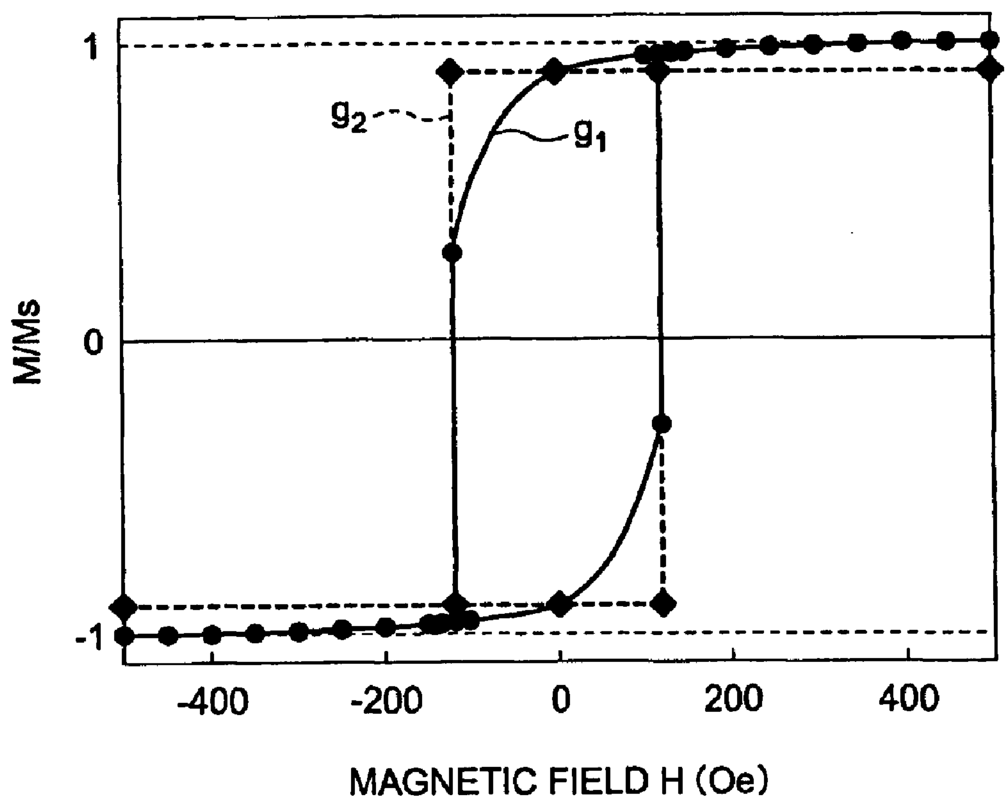
FIG. 7 shows the magnetization curve of the magnetoresistive element of the second embodiment.

FIG. 7 shows a simulated hysteresis loop of the magnetoresistive element 2 of this element. In FIG. 7, the horizontal axis represents external magnetic field, and the vertical axis represents values obtained by normalizing the magnetization values M by the saturation magnetization Ms. The solid line graph $g_1$ of FIG. 7 represents the magnetization curve in the direction of easy axis of the storage layer $2e_1$, and the broken line graph $g_2$ represents residual magnetization curve, which shows the state of magnetization when the external magnetic field, after being applied, is made to be zero. From FIG. 7, the coercive force in the easy axis direction can be determined to be 110 Oe. Thus, the coercive force in the easy magnetization axis direction is improved as compared with the first embodiment, i.e., the thermal stability is improved as compared with the first embodiment.

Furthermore, as can be understood from FIG. 7, the residual magnetization of the magnetoresistive element of this embodiment is maintained to be as high as 0.927, and it sharply changes at the switching field, i.e., a sharp switching operation is performed, and the magnetization state does not show any intermediate state other than "1" and "0." This means that no complicated minute magnetic domain is generated.

Figure 8A:
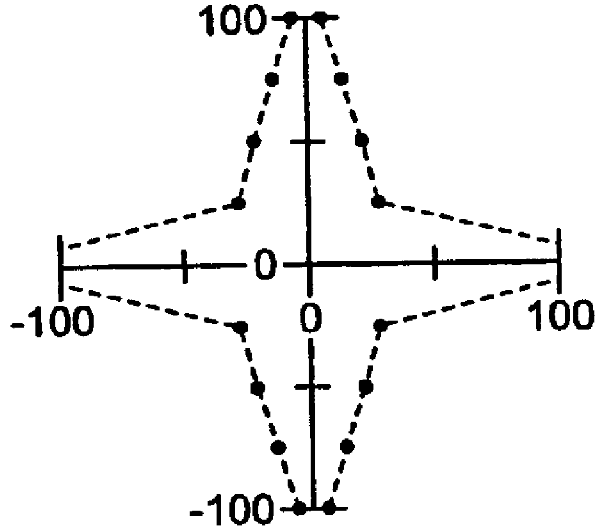
FIGS. 8A and 8B show the results of the calculation of astroid curves of the switching field of the magnetoresistive element of the second embodiment.
Figure 8B:
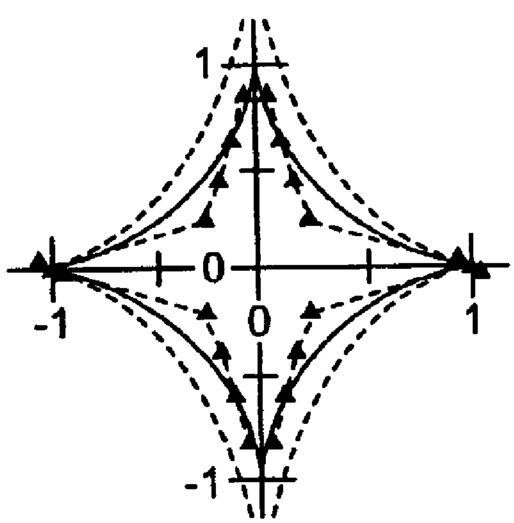

FIG. 8A shows the astroid curve of the switching field of the magnetoresistive element of this embodiment, which is simulated. FIG. 8B shows the astroid curve obtained by normalizing the magnetic fields of the horizontal and vertical axes by the coercive force in the direction of easy magnetization axis. In FIGS. 8A and 8B, the horizontal axes represent magnetic field in the direction of easy magnetization axis, and the vertical axes represent magnetic field in the direction of hard magnetization axis. The solid line in FIG. 8B shows an ideal astroid curve of the switching field.

As can be understood from FIGS. 8A and 8B, the simulation result for the cell shape of this embodiment is within the ideal astroid curve in substantially all directions. Thus, the switching field of the magnetoresistive element of this embodiment is lower than that of the first embodiment. Thus, in this embodiment, it is possible to reverse the magnetization with a smaller switching field, i.e., it is possible to lower the current that is required to write information. The coercive force in the easy magnetization axis in this embodiment is greater than that of the first embodiment, and the thermal stability of this embodiment is improved in comparison to the first embodiment.

Unlike with conventional elements, the area of edge domains is not decreased in the element of this embodiment, but rather an area of certain size is given to edge domains. A bias magnetic field is applied to the end portion thereof, so that the edge domains work as the core of magnetization reversal without being pinned.

As described above, this embodiment has a thermally stable magnetic structure, and according to this embodiment, it is possible to decrease the switching field that is required to write information.

Figure 9:
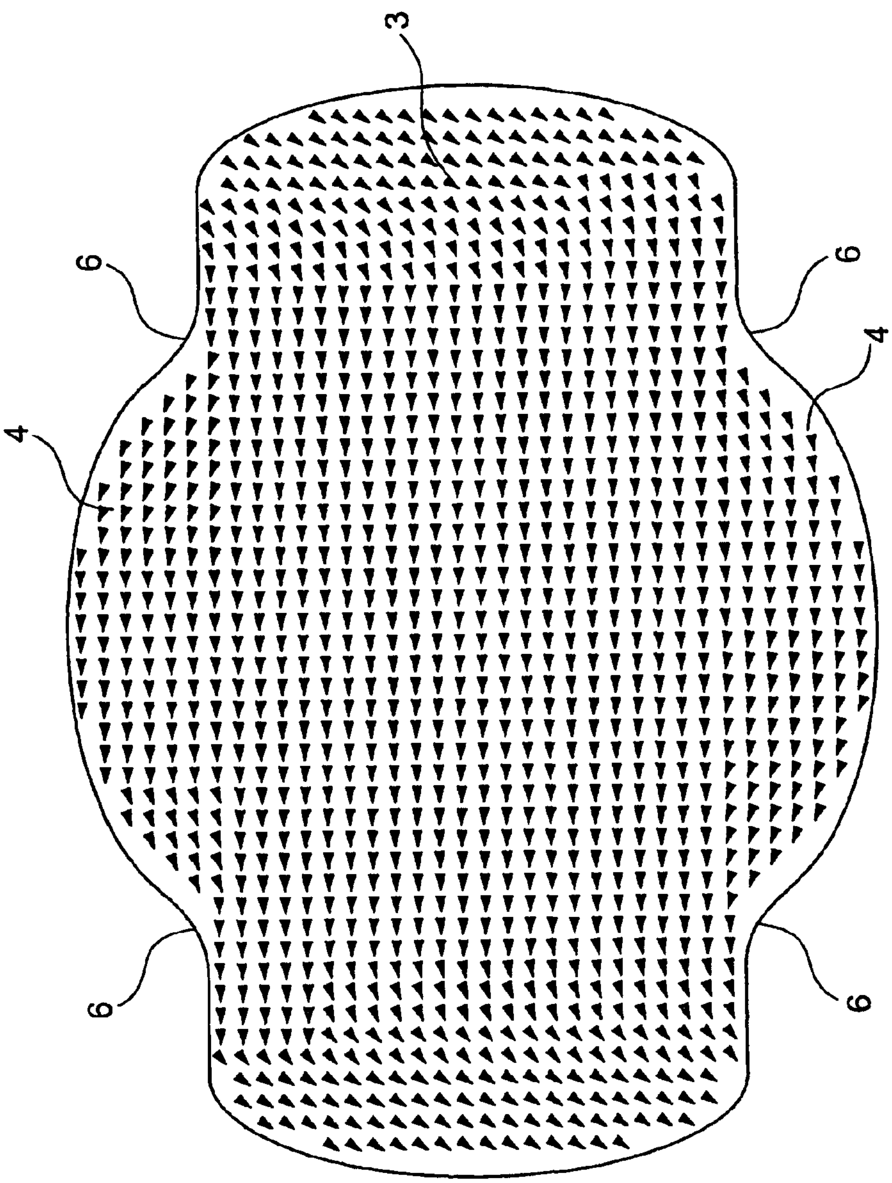
FIG. 9 shows the shape of the top surface of a storage layer of a magnetoresistive element according to a modification of the second embodiment.

In the second embodiment, the junction portions between the main body 3 and the projections 4 of the storage layer 2*e*1 are not rounded. However, the junction portions 6 can be rounded as shown in FIG. 9. In this case, the coercive force in the easy magnetization axis direction can be increased further, and the switching field can be decreased further.

Moreover, in this embodiment, it is preferable that the maximum width be less than about 1 $\mu$m, and the length be in the range of equal to or more than about 1.3 times the maximum width and equal to or less than 10 times the maximum width.

Moreover, in the first and second embodiments, the thickness of the storage layer is 2 nm, but the thickness of the storage layer is not limited to 2 nm.

(Third Embodiment)

Figure 15:
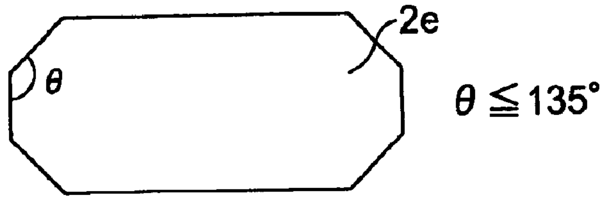
FIG. 15 shows the shape of the top surface of a storage layer of a magnetoresistive element according to the third embodiment of the present invention.

Next, a magnetoresistive element according to the third embodiment will be described with reference to FIGS. 15 to 17. FIG. 15 shows the shape of the top surface of the storage layer 2*e* of the magnetoresistive element of this embodiment. As can be understood from FIG. 15, the storage layer 2*e* of this embodiment is obtained by trimming the four corners of the rectangular storage layer of the conventional magnetoresistive element shown in FIG. 14 so as to form an octagon shape. Inner angle θ formed by the pair of opposite sides perpendicular to the major axis serving as an easy magnetization axis and the lines adjacent thereto is 135 degrees or less.

Figure 16:
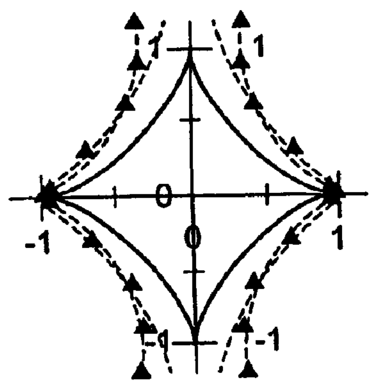
FIG. 16 shows the results of the calculation of astroid curves of the switching field of the magnetoresistive element of the third embodiment.
Figure 17:
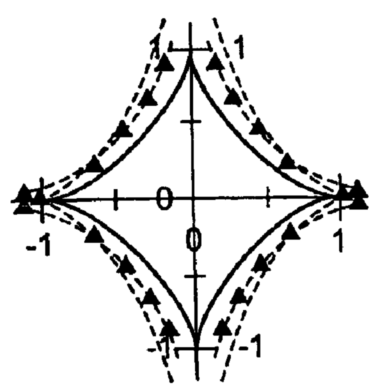
FIG. 17 shows the results of the calculation of astroid curves of the switching field of another magnetoresistive element of the third embodiment.

FIGS. 16 and 17 show the astroid curves of the switching field of the magnetoresistive element of this embodiment, which are simulated. FIG. 16 shows the case where the angle θ is 135 degrees, and FIG. 17 shows the case where the angle θ is 120 degrees. FIGS. 16 and 17 also show astroid curves obtained by normalizing the magnetic fields of the horizontal and vertical axes by the coercive force in the direction of easy magnetization axis. The solid line in each figure shows ideal an astroid curve of the switching field.

As can be understood from these figures, in the case of the cell of this embodiment having the angle θ of 135 degrees, the switching characteristics are good. Further, the astroid curve moves closer to the ideal one if the angle θ is changed to 120 degrees. Thus, the switching field of the magnetoresistive element of this embodiment is decreased. Accordingly, it is possible to perform the writing operation with a smaller magnetic field.

Although the switching characteristics of the magnetoresistive element according to this embodiment are inferior to those of the first embodiment, the magnetoresistive element of this embodiment is easier to fabricate. In addition, since the storage layer of this embodiment has a convex shape, this embodiment is more effective than the first embodiment when it is integrated with other elements.

It is preferable that, as in the case of the second embodiment, each side of the storage layer 2*e* of this embodiment be curved so as to project outwardly. Further, it is preferable that all inner angles of the octagonal storage layer are 135 degrees.

Further, it is preferable that the maximum width of this embodiment be about 1 μm or less, and the length be about the same as the maximum width, or more than the same as and less than ten times the maximum length.

Each of the magnetoresistive elements of the first to third embodiments has only a single ferromagnetic tunnel junction. However, two ferromagnetic tunnel junctions can be provided thereto. That is, each magnetoresitance effect element can have a five-layer structure, i.e., ferromagnetic layer/tunnel barrier/ferromagnetic layer/tunnel barrier/ferromagnetic layer. Further, it is possible to have similar effects if at least two ferromagnetic layers are deposited via a non-magnetic layer, the magnetization direction of one ferromagnetic layer being pinned, and the magnetization direction of the other ferromagnetic layer being changed in accordance with the external magnetic field.

Although the ferromagnetic layer of the magnetoresistive element serving as a storage layer or a reference layer is a single layer in the first to third embodiments, a multi-layer structure formed by depositing at least two ferromagnetic layers via a non-magnetic layer can be used as a storage layer or a reference layer having similar effects. The magnetic material used here can be any of the generally used magnetic materials such as Fe, Co, Ni, a multi-layer structure using these materials, an alloy of these materials, etc. Further, the non-magnetic metal material can be any of the generally used materials such as Cu, Au, Ru, Al, etc. Furthermore, a magnetic coupling can exist between the two ferromagnetic layers sandwiching the non-magnetic layer.

Next, methods of manufacturing the magnetoresistive elements according to the first to third embodiments will be described below.

Generally, such an element is formed by applying a resist to a magnetoresistance effect layer, pattering the resist by the use of any of light, electron beam, and x-ray, developing the resist pattern, performing ion milling or etching to form a pattern on the magnetoresistance effect layer, and removing the resist.

When a magnetoresistive element having a relatively large size, e.g., on the order of microns, is manufactured, a TMR layer is sputtered, then a hard mask of silicon oxide, silicon nitride, etc. is formed, and then the pattern of magnetoresistive element as shown in, e.g., FIGS. 1, 6, or 9 is formed by reactive ion etching (RIE). The magnetoresistive element can be made by ion milling this workpiece.

A smaller magnetoresistive element of submicron size, e.g., from 0.1 μm to 2–3 μm, can be manufactured by the use of optical lithography techniques. In this case, a hard mask having the pattern of the magnetoresistive elements of the above-described embodiments are formed in advance.

A further smaller size, e.g., about 0.5 μm or less of magnetoresistive element can be formed by the use of electron beam exposure techniques. Since the size of the magnetoresistive element is very small in this case, the portions, which are provided to increase the edge domain area, become further smaller. This makes the manufacture of the element very difficult. In order to overcome this problem, the proximity effect correction of electron beam can be used to form the patterns of the above-described embodiments. Generally, the proximity effect correction is performed to correct the proximity effect in a figure caused by back scattering of electron beam from the substrate, so as to form a correct pattern. For example, when a rectangular pattern is intended to form, lack of accumulated charge may occur near the corner portions, resulting in that the corners are rounded. In order to clearly form the intended angle at a corner portion, especially in the case where the width of the element is about 0.5 μm or less, correction beam is injected outside the pattern of the magnetoresistive element, thereby obtaining a right-shape pattern. An element having widened end portions can be formed by using this method. For example, when an element having the shape shown in FIGS. 6 or 9 is formed, a rectangle is used as a basic pattern, and widened ends can be obtained by injecting correction beams around two opposite corners. In this case, the shape can be corrected beyond the degree to simply form correct angles by using at least one of 1) increasing the amount of injected charge as compared with the case of the normal proximity effect correction, and 2) appropriately adjusting the injection points of the correction beams. As the result, it is possible to obtain the shapes of the above-described embodiments.

Next, the application of the magnetoresistive elements of the above-described embodiments to the cells of a magnetic random access memory (magnetic memory) will be described below.

Generally, a random access memory is required to have a small die size, and a large capacity. Accordingly, the wiring width and the cell area should inevitably be reduced. If the magnetoresistive elements of the above-described embodiments are used in a random access memory, it is possible to achieve a lower-power-consumption and high-speed switching operation since the switching field is decreased, thereby lowering a writing current required to write storage bit. Thus, the magnetoresistive element according to the present invention is suitable for use in the cells of a random access memory.

Next, specific examples of the architecture of a random access memory according to the present invention will be described with reference to FIGS. 10 to 13.

Figure 10:
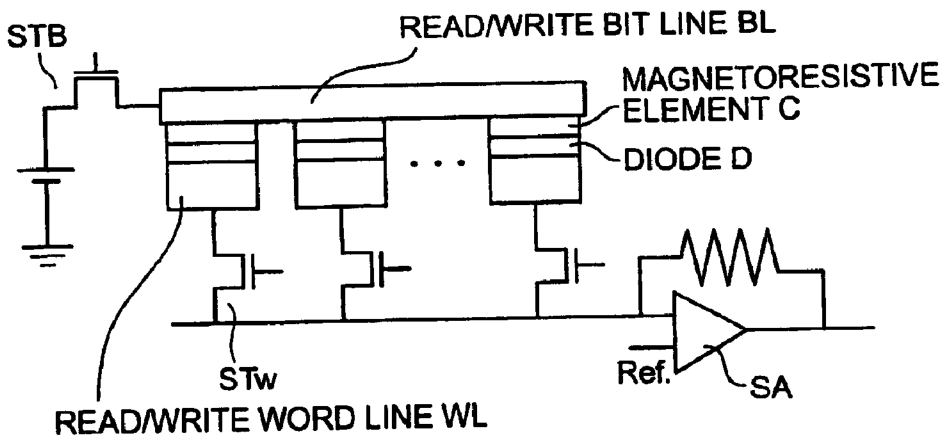
FIG. 10 shows the first specific example of architecture of a magnetic random access memory.

FIG. 10 schematically shows the first specific example of the architecture of a magnetic random access memory. That is, FIG. 10 shows the cross-sectional structure of a memory array. In this architecture, a plurality of magnetoresistive elements C are connected in parallel with a read/write bit line BL. The other end of each magnetoresistive element C is connected to a read/write word line WL via a diode D. Each word line WL is connected to a sense amplifier SA via a selecting transistor STw for selecting the word line. Further, the read/write bit line BL is grounded via a selecting transistor STB for selecting the bit line BL.

In the magnetic memory according to the first specific example shown in FIG. 10, when a reading operation is performed, the selecting transistors STB and STw select the bit line BL and the word line WL connected to the target magnetoresistive element C, and the sense amplifier SA detects a current thereof. When a write operation is performed, the selecting transistors STB and STw select the bit line BL and the word line WL connected to the target magnetoresistive element C, and a write current flows therethrough. In this case, the writing is accomplished by directing the magnetization of the storage layer of the magnetoresistive element C to a predetermined direction by a write magnetic field obtained by combining the magnetic fields occurring to the bit line BL and the word line WL.

The diode D has a function to interrupt a current flowing via the other magnetoresistive elements C connected in a matrix form.

Next, the second specific example of the architecture of a magnetic random access memory will be described with reference to FIG. 11.

Figure 11:
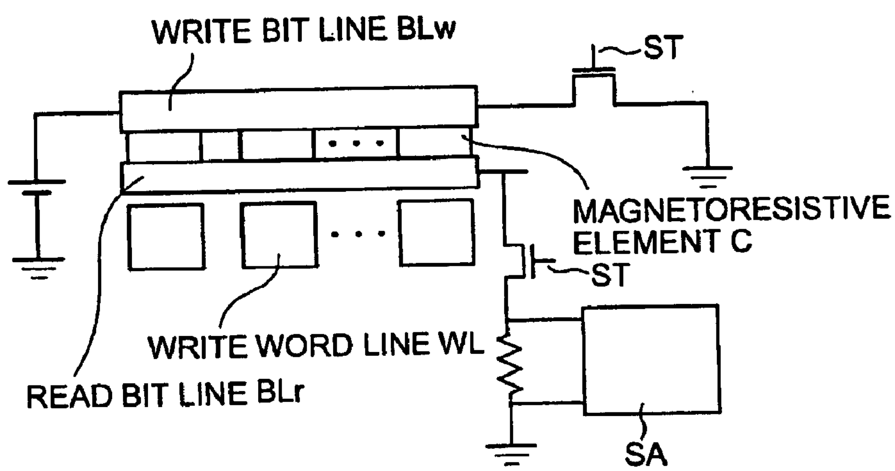
FIG. 11 shows the second specific example of architecture of a magnetic random access memory.

FIG. 11 schematically shows the second specific example of the architecture of a magnetic random access memory, in which the memory array can have a multi-layer structure. That is, FIG. 11 shows the cross-sectional structure of a memory array.

In this architecture, a "ladder structure", in which a plurality of magnetoresistive elements C are connected in parallel between a write bit line BLw and a read bit line BLr, is utilized. Further, a write word line WL is located near each magnetoresistive element C in a direction crossing the bit line BLw.

A writing operation is performed on the magnetoresistive element by applying to the storage layer of the magnetoresistive element a synthesis magnetic field obtained by combining the magnetic field generated by a writing current flowing through the write bit line BLw and the magnetic field generated by a writing current flowing through the write word line WL.

When a reading operation is performed, a voltage is applied between the bit lines BLw and BLr. As a result, a current flows through all the magnetoresistive elements connected in parallel between the bit lines BLw and BLr. The magnetization of the storage layer of the target magnetoresistive element is directed to a desired direction by passing a writing current through the word line WL near the target magnetoresistive element, while detecting the sum of the current flowing through all the magnetoresistive elements connected in parallel between the bit lines BLw and BLr. It is possible to perform the intended reading operation by detecting the change in current at this time.

That is, if the magnetization direction of the storage layer before the writing operation is the same as that after the writing operation, the current detected by the sense amplifier SA does not change. If the magnetization direction is reversed between before and after the writing operation, the current changes due to the magnetoresistance effect. Thus, it is possible to read the magnetization direction, i.e., the data stored in the storage layer before the writing operation. This method corresponds to so-called "destructive read out", in which the stored data is changed during a reading operation.

If a magnetoresistive element is adjusted to have a structure of magnetization free layer/tunnel barrier layer/magnetic storage layer, it is possible to perform a "non-destructive read out". That is, when using a magnetoresistive element having the above-described structure, it is possible to read out the magnetization direction of the storage layer by recording the magnetization direction in the storage layer, changing the magnetization direction of the magnetization free layer, and comparing the sensed currents. In this case, however, it is necessary to design the element in such a way that the magnetization reversal field of the magnetization free layer is smaller than that of the storage layer.

Figure 12:
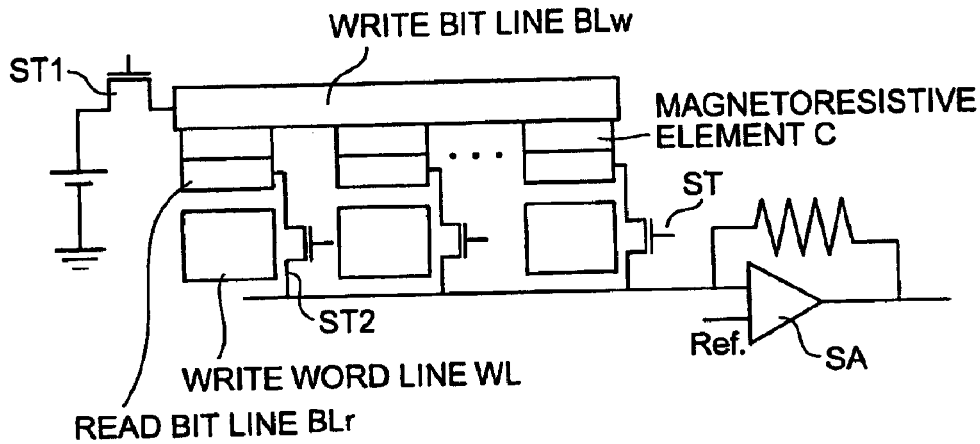
FIG. 12 shows the third specific example of architecture of a magnetic random access memory.

FIG. 12 schematically shows the third specific example of the architecture of a random access memory. That is, FIG. 12 shows the cross-sectional structure of a memory array.

In this architecture, a plurality of magnetoresistive elements C are connected in parallel with a write bit line BLw, and the other end of each magnetoresistive element C is connected to a read bit line BLr, thereby forming a matrix form. Further, a word line WL is located near each read bit line BLr in a direction parallel to each bit line.

The writing operation is performed on the magnetoresistive element C by applying to the storage layer of the magnetoresistive element C a synthesis magnetic field obtained by combining a magnetic field generated by a writing current flowing through the write bit line BLw and a magnetic field generated by a writing current flowing through the write word line WL.

The reading operation is performed by selecting the write bit line BLw and the read bit line BLr by the use of the selecting transistor ST, thereby allowing a sense current to flow through the target magnetoresistive element, which is detected by the sense amplifier.

Next, the fourth specific example of the architecture of a magnetic random access memory will be described below with reference to FIG. 13.

Figure 13:
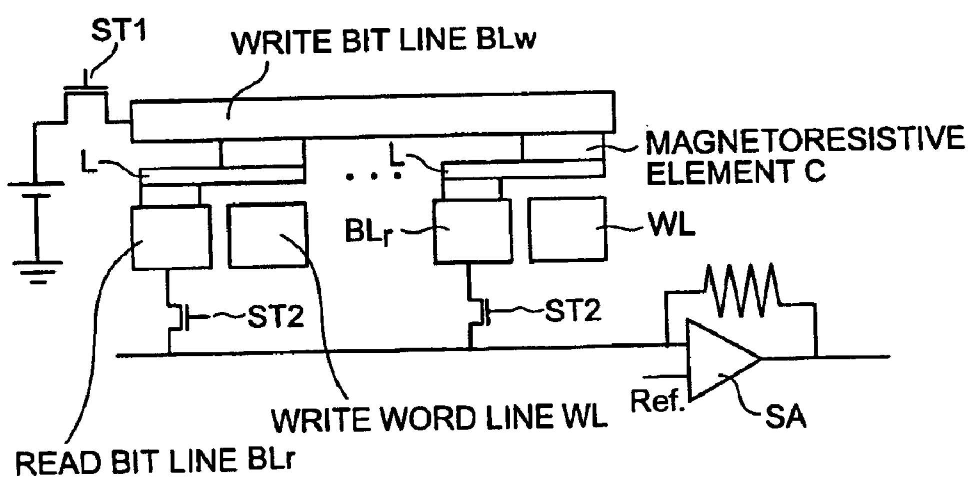
FIG. 13 shows the fourth specific example of architecture of a magnetic random access memory.

FIG. 13 schematically shows the fourth specific example of the architecture of a magnetic random access memory. That is, FIG. 13 shows the cross-sectional structure of a memory array. The difference between the fourth specific example and the third specific example lies in that the read bit line BLr is connected to the magnetoresistive element C via a lead L, and the write word line WL is located directly below the magnetoresistive element C. With this structure, the distance between the magnetoresistive element C and the write word line WL can be decreased as compared to the structure shown in FIG. 12. As a result, it is possible to apply the writing magnetic field of the word line WL more effectively to the magnetoresistive element.

As described above, according to the present invention, it is possible to obtain a thermally stable magnetic structure and a switching field required to write information.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetoresistive element comprising:

a first reference layer, in which a direction of magnetization is fixed; and a storage layer including a main body, in which a length in an easy magnetization axis direction is longer than a length in a hard magnetization axis direction, and a projecting portion provided to a central portion of the main body in the hard magnetization axis direction, a direction of magnetization of the storage layer being changeable in accordance with an external magnetic field, wherein a joint portion between the main body and the projecting portion is rounded.

2. The magnetoresistive element according to claim 1, wherein an end portion of the storage layer is rounded.

3. The magnetoresistive element according to claim 1, wherein the first reference layer includes at least one ferromagnetic layer, the storage layer includes at least one ferromagnetic layer, and a first insulating layer serving as a first tunnel barrier is provided between the first reference layer and the storage layer.

4. The magnetoresistive element according to claim 3, further comprising a second reference layer including at least one ferromagnetic layer, wherein the storage layer is located between the first reference layer and the second reference layer, and a second insulating layer serving as a second tunnel barrier is provided between the second reference layer and the storage layer.

5. The magnetoresistive element according to claim 3, wherein at least one of the first reference layer and the storage layer includes at least two of ferromagnetic layers which are provided via a nonmagnetic layer.

6. The magnetoresistive element according to claim 1, wherein the main body and the projecting portion form a cross shape.

7. The magnetoresistive element according to claim 6, wherein an end portion of the storage layer is rounded.

8. The magnetoresistive element according to claim 6, wherein the first reference layer includes at least one ferromagnetic layer, the storage layer includes at least one ferromagnetic layer, and a first insulating layer serving as a first tunnel barrier is provided between the first reference layer and the storage layer.

9. The magnetoresistive element according to claim 8, further comprising a second reference layer including at least one ferromagnetic layer, wherein the storage layer is located between the first reference layer and the second reference layer, and a second insulating layer serving as a second tunnel barrier is provided between the second reference layer and the storage layer.

10. The magnetoresistive element according to claim 8, wherein at least one of the first reference layer and the storage layer includes at least two of ferromagnetic layers which are provided via a nonmagnetic layer.

11. A magnetic memory comprising:

a first wiring line; p1 a second wiring line; and a magnetoresistive element according to claim 6, which is provided to an intersection of the first wiring line and the second wiring line.

12. A magnetic memory comprising:

a first wiring line;

a second wiring line; and a magnetoresistive element according to claim 1, which is provided to an intersection of the first wiring line and the second wiring line.

13. A magnetoresistive element comprising:

a first reference layer, in which a direction of magnetization is fixed; and a storage layer in which a direction of magnetization is changeable in accordance with an external magnetic field, and a width of a central portion is wider than a width of an end portion, the storage layer having a curved outline which is inwardly constricted at a portion between the central portion and the end portion.

14. The magnetoresistive element according to claim 13, wherein an end portion of the storage layer is rounded.

15. The magnetoresistive element according to claim 13, wherein the first reference layer includes at least one ferromagnetic layer, the storage layer includes at least one ferromagnetic layer, and a first insulating layer serving as a first tunnel barrier is provided between the first reference layer and the storage layer.

16. The magnetoresistive element according to claim 15, further comprising a second reference layer including at least one ferromagnetic layer, wherein the storage layer is located between the first reference layer and the second reference layer, and a second insulating layer serving as a second tunnel barrier is provided between the second reference layer and the storage layer.

17. The magnetoresistive element according to claim 15, wherein at least one of the first reference layer and the storage layer includes at least two of ferromagnetic layers which are provided via a nonmagnetic layer.

18. A magnetic memory comprising:

a first wiring line;

a second wiring line; and a magnetoresistive element according to claim 13, which is provided to an intersection of the first wiring line and the second wiring line.

19. A magnetoresistive element comprising:

a first reference layer, in which a direction of magnetization is fixed; and a storage layer having an octagonal shape, in which a pair of opposite sides are perpendicular to an easy magnetization axis, an inner angle formed by each of the pair of opposite sides and an adjacent side is 135 degrees or less, and a direction of magnetization is changeable in accordance with an external magnetic field.

20. The magnetoresistive element according to claim 19, wherein an end portion of the storage layer is rounded.

21. The magnetoresistive element according to claim 19, wherein the first reference layer includes at least one ferromagnetic layer, the storage layer includes at least one ferromagnetic layer, and a first insulating layer serving as a first tunnel barrier is provided between the first reference and the storage layer.

22. The magnetoresistive element according to claim 21, further comprising a second reference layer including at least one ferromagnetic layer, wherein the storage layer is located between the first reference layer and the second reference layer, and a second insulating layer serving as a second tunnel barrier is provided between the second reference layer and the storage layer.

23. The magnetoresistive element according to claim 21, wherein at least one of the first reference layer and the storage layer includes at least two of ferromagnetic layers which are provided via a nonmagnetic layer.

24. The magnetoresistive element according to claim 19, wherein each inner angle of the octagonal shape is 135 degrees.

25. A magnetic memory comprising:

a first wiring line;

a second wiring line; and a magnetoresistive element according to claim 19, which is provided to an intersection of the first wiring line and the second wiring line.

* * * * *